(12) United States Patent
Tsukamoto et al.

(10) Patent No.: US 10,200,012 B2
(45) Date of Patent: Feb. 5, 2019

(54) HIGH-FREQUENCY FILTER, FRONT-END CIRCUIT, AND COMMUNICATION APPARATUS

(71) Applicant: Murata Manufacturing Co., Ltd., Kyoto (JP)

(72) Inventors: Hideki Tsukamoto, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/718,330

(22) Filed: Sep. 28, 2017

(65) Prior Publication Data

US 2018/0019731 A1  Jan. 18, 2018

Related U.S. Application Data

(63) Continuation of application No. PCT/JP2016/060131, filed on Mar. 29, 2016.

(30) Foreign Application Priority Data

Mar. 30, 2015  (JP) .................................. 2015-068030

(51) Int. Cl.
*H03H 9/54* (2006.01)
*H03H 9/64* (2006.01)
(Continued)

(52) U.S. Cl.
CPC .......... *H03H 9/542* (2013.01); *H03H 9/0009* (2013.01); *H03H 9/6406* (2013.01);
(Continued)

(58) Field of Classification Search
CPC ...... H03H 9/0009; H03H 9/542; H03H 9/547; H03H 9/568; H03H 9/6406; H03H 9/6409;
(Continued)

(56) References Cited

U.S. PATENT DOCUMENTS 6,177,850 B1 * 1/2001 Furutani .............. H03H 7/0123
333/185
6,472,953 B1  10/2002 Sakuragawa
(Continued)

FOREIGN PATENT DOCUMENTS

JP  01-265711 A  * 10/1989
JP  H07-015268 A  1/1995
(Continued)

OTHER PUBLICATIONS

English language machine translation of JP 01-265711 A, published Oct. 23, 1989, 2 pages.*
(Continued)

*Primary Examiner* — Barbara Summons
(74) *Attorney, Agent, or Firm* — Pearne & Gordon LLP

(57) ABSTRACT

A high-frequency filter (10) includes resonators (21, 31, and 32), an inductor (41), and a switch (51). The resonator (21) is connected between a first input/output terminal (P1) and a second input/output terminal (P2). One end of the inductor (41) is connected between the resonator (21) and the first input/output terminal (P1). One end of the resonator (31) is connected to the other end of the inductor (41). The switch (51) selects either a connection portion that connects the inductor (41) and the resonator (31) or the resonator (32) and connects either the connection portion or the resonator (32), which has been selected, to a terminal of the resonator (21) on the side of the second input/output terminal (P2). The switching between the connection modes of the switch (51) changes the circuit configuration of the high-frequency filter (10).

20 Claims, 14 Drawing Sheets

(51) Int. Cl.
    *H03H 9/70*     (2006.01)
    *H03H 9/72*     (2006.01)
    *H03H 9/00*     (2006.01)

(52) U.S. Cl.
    CPC ........ *H03H 9/6423* (2013.01); *H03H 9/6483* (2013.01); *H03H 9/706* (2013.01); *H03H 9/725* (2013.01)

(58) Field of Classification Search
    CPC .. H03H 9/6423; H03H 9/6433; H03H 9/6483; H03H 9/706; H03H 9/725
    USPC .......................................... 333/133, 189, 193
    See application file for complete search history.

(56) References Cited

U.S. PATENT DOCUMENTS 6,525,624 B1 * 2/2003 Hikita .................. H03H 7/0161
    333/133

2006/0164183 A1     7/2006   Tikka
2009/0201104 A1     8/2009   Ueda
2016/0118956 A1 * 4/2016   Kihara .................. H03H 9/25
    333/133

FOREIGN PATENT DOCUMENTS

| | | |
|---|---|---|
| JP | 2000-323961 A | 11/2000 |
| JP | 2006-502634 A | 1/2006 |
| JP | 2009-207116 A | 9/2009 |
| JP | 2010-206843 A | 9/2010 |
| WO | 2015/002047 A1 | 1/2015 |

OTHER PUBLICATIONS

International Search Report issued in Application No. PCT/JP2016/060131 dated Jun. 21, 2016.

Written Opinion issued in Application No. PCT/JP2016/060131 dated Jun. 21, 2016.

* cited by examiner

FIG. 1
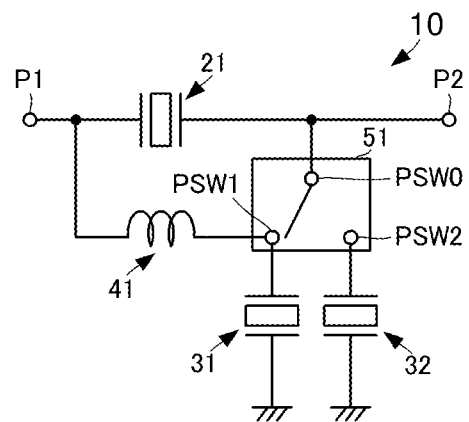
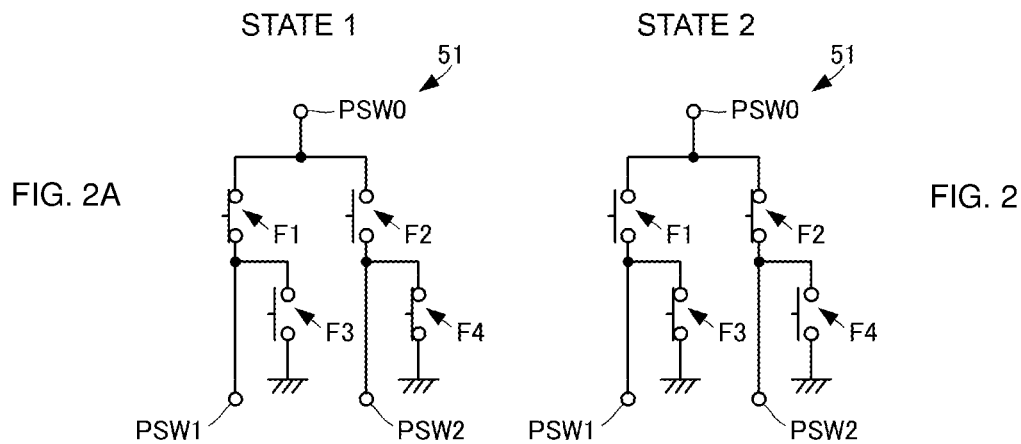

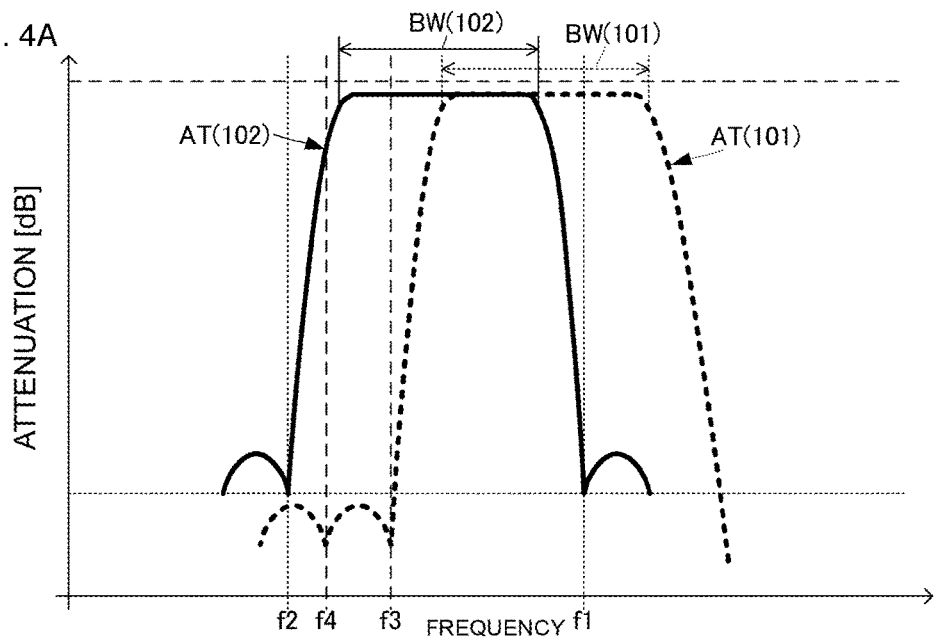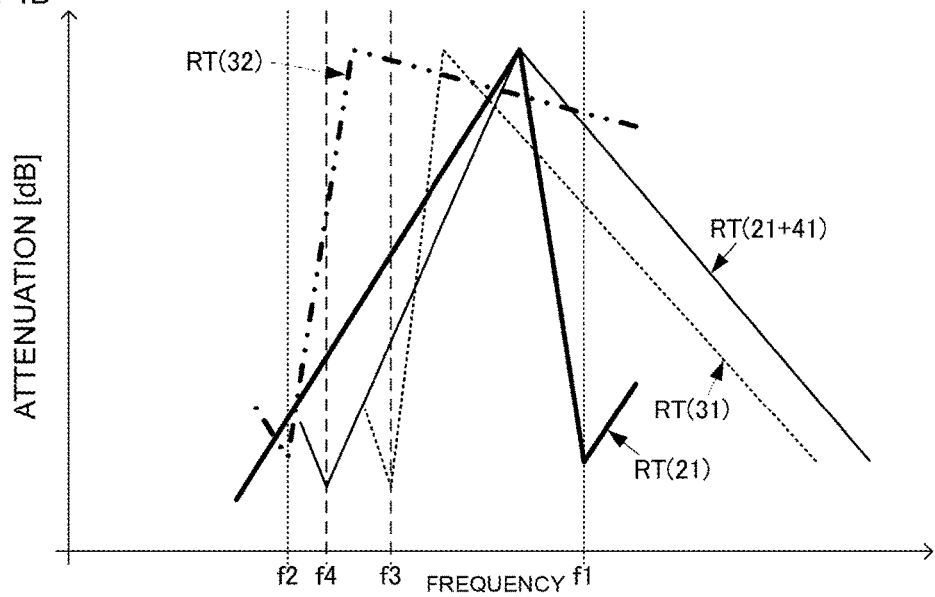

HIGH-FREQUENCY FILTER, FRONT-END CIRCUIT, AND COMMUNICATION APPARATUS

This is a continuation of International Application No. PCT/JP2016/060131 filed on Mar. 29, 2016 which claims priority from Japanese Patent Application No. 2015-068030 filed on Mar. 30, 2015. The contents of these applications are incorporated herein by reference in their entireties.

BACKGROUND OF THE DISCLOSURE

Field of the Disclosure

The present disclosure relates to a high-frequency filter utilizing the resonant frequency and anti-resonant frequency of a resonator, a front-end circuit, and a communication apparatus.

Description of the Related Art

Various high-frequency filters have been devised. These high-frequency filters include a variable-frequency filter disclosed in, for example, Patent Document 1. A variable-frequency filter, which is a single high-frequency filter, can provide a plurality of filter characteristics (bandpass characteristics and attenuation characteristics) corresponding to different passbands.

The variable-frequency filter disclosed in Patent Document 1 includes a plurality of piezoelectric resonators and a switch. The variable-frequency filter disclosed in Patent Document 1 changes the combination of piezoelectric resonators by switching between connection modes of the switch. As a result, a plurality of different transmission characteristics (attenuation characteristics) are provided.

Patent Document 1: Japanese Unexamined Patent Application Publication No. 2009-207116

BRIEF SUMMARY OF THE DISCLOSURE

However, for example, in the variable-frequency filter disclosed in Patent Document 1 which is illustrated in FIGS. 11A and 11B, a single switch forms only a single attenuation pole. The variable-frequency filter therefore cannot cover a Band requiring steepness, for example, the Band 28. In a case where two switches are used to form two attenuation poles, the size of a filter is increased.

It is an object of the present disclosure to provide a small-sized high-frequency filter in which two attenuation poles are formed by a single switch and good isolation characteristics are obtained.

A high-frequency filter according to the present disclosure includes a first resonator, a second resonator, a third resonator, a first reactance element, and a switch. The first resonator is connected between a first input/output terminal and a second input/output terminal. One end of the first reactance element is connected between the first resonator and the first input/output terminal. One end of the second resonator is connected to the other end of the first reactance element. The switch selects either the third resonator or a connection portion that connects the first reactance element and the second resonator and connects either the third resonator or the connection portion, which has been selected, to a terminal of the first resonator on a side of the second input/output terminal.

With this configuration, a plurality of types of circuits can be realized using a plurality of resonators and a reactance element. Since one of a mode in which the reactance element is used to change the characteristics of a resonator and a mode in which the reactance element is used as a matching circuit for a resonator can be selected, a greater variety of filter characteristics can be realized.

In the high-frequency filter according to the present disclosure, the second resonator and the third resonator are preferably connected to a ground.

In this configuration, the second resonator and the third resonator are connected in shunt with each other between a transmission line connecting the first input/output terminal and the second input/output terminal and a ground. As compared with a circuit including no resonator connected in shunt with each other, a greater variety of filter characteristics can be realized.

In the high-frequency filter according to the present disclosure, the switch may connect an unselected side to the ground.

With this configuration, it is possible to suppress the effect of an unselected resonator on filter characteristics.

The high-frequency filter according to the present disclosure may further include a second reactance element connected in parallel to the third resonator.

With this configuration, a greater variety of filter characteristics can be realized.

The high-frequency filter according to the present disclosure may further include a fourth resonator and a third reactance element. The fourth resonator is connected between a connection portion that connects the first resonator and the switch and the second input/output terminal. The third reactance element is connected between a connection portion that connects the first reactance element and the second resonator and the second input/output terminal.

With this configuration, a greater variety of filter characteristics can be realized.

In the high-frequency filter according to the present disclosure, the first reactance element may be an inductor or a capacitor.

With this configuration, a greater variety of filter characteristics can be realized. For example, in a case where the first reactance element is an inductor, one of a mode in which the inductor is used to shift the anti-resonant point of a resonator and a mode in which the inductor is simply used as a matching circuit can be selected. A greater variety of filter characteristics can therefore be realized. In a case where the first reactance element is a capacitor, one of a mode in which the capacitor is used to shift the anti-resonant point of a resonator and a mode in which the capacitor is simply used as a matching circuit can be selected. A greater variety of filter characteristics can therefore be realized.

In the high-frequency filter according to the present disclosure, the first reactance element, the second reactance element, and the third reactance element may be inductors. Alternatively, the first reactance element and the third reactance element may be capacitors.

With this configuration, a greater variety of filter characteristics can be realized.

A high-frequency filter according to the present disclosure supports a first communication band and a second communication band, which has a center frequency higher than that of the first communication band and partly overlaps the first communication band, and includes a first terminal and a second terminal. The high-frequency filter includes a ladder resonant circuit and an attenuation circuit. The ladder resonant circuit is placed between the first terminal and the second terminal and includes at least one or more series arm resonators and at least one or more parallel arm resonators. The attenuation circuit is connected to a node between the ladder resonant circuit and the second terminal. The attenuation circuit includes a resonator and a switch. One end of the resonator is connected to a first selection target terminal of the switch and the other end of the resonator is connected to a ground potential. The switch includes the first selection target terminal connected to the resonator, a second selection target terminal connected to a ground, and a common terminal that is selectively connected to the first selection target terminal or the second selection target terminal and is connected to the node. The high-frequency filter switches between a state for a second communication band where the common terminal and the first selection target terminal of the switch are connected and a state for a first communication band where the common terminal and the second selection target terminal of the switch are connected.

With this configuration, filter characteristics corresponding to a plurality of different communication bands that partly overlap can be realized with a single switch.

The high-frequency filter according to the present disclosure may further include a longitudinally coupled resonant circuit that includes a plurality of longitudinally coupled resonators and is connected in series to the ladder resonant circuit.

With this configuration, filter characteristics corresponding to a plurality of different communication bands that partly overlap can be realized with a single switch.

A front-end circuit according to the present disclosure includes a branching circuit, a transmission-side amplification circuit, and a reception-side amplification circuit. The branching circuit includes a transmission filter for performing filter processing upon a transmission signal and a reception filter for performing filter processing upon a reception signal. The transmission-side amplification circuit is connected to the transmission filter. The reception-side amplification circuit is connected to the reception filter. At least one of the transmission filter and the reception filter is one of the above-described high-frequency filters.

With this configuration, low-loss communication can be performed in a specified communication band and spurious emission regulation can be complied with.

A communication apparatus according to the present disclosure includes the above-described front-end circuit and an RFIC that is connected to the transmission-side amplification circuit and the reception-side amplification circuit and generates a control signal for the switch.

With this configuration, low-loss communication can be performed in a plurality of selectable communication bands and spurious emission regulation can be complied with.

According to the present disclosure, a single switch can form two attenuation poles. A small-sized high-frequency filter having high isolation characteristics can therefore be realized.

BRIEF DESCRIPTION OF THE SEVERAL VIEWS OF THE DRAWINGS

FIG. 1 is a circuit diagram of a high-frequency filter according to a first embodiment of the present disclosure.

Each of FIGS. 2A and 2B is an equivalent circuit diagram of a switch of a high-frequency filter according to the first embodiment of the present disclosure.

Figure 3A:
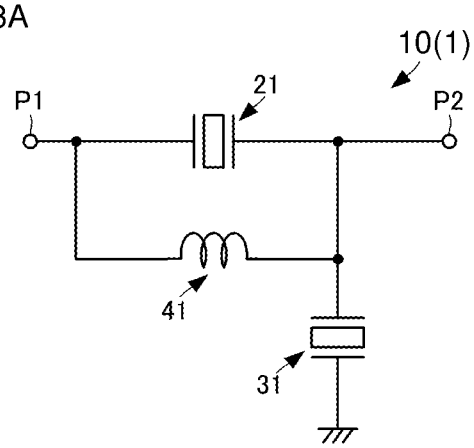
Figure 3B:
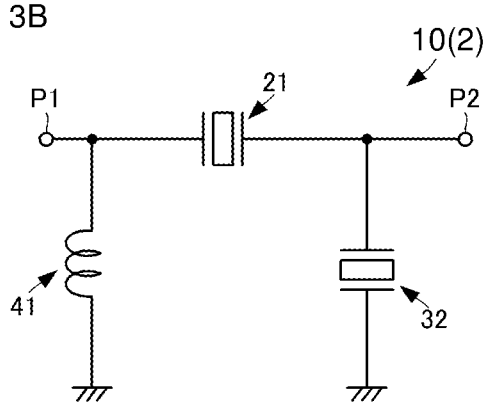

FIG. 3A is an equivalent circuit diagram of a high-frequency filter according to the first embodiment of the present disclosure in a first connection mode, and FIG. 3B is an equivalent circuit diagram of a high-frequency filter according to the first embodiment of the present disclosure in a second connection mode.

FIGS. 4A is a graph indicating filter characteristics of a high-frequency filter according to the first embodiment of the present disclosure, and FIG. 4B is a graph indicating attenuation characteristics based on the impedance characteristics of a resonator in a high-frequency filter according to the first embodiment of the present disclosure.

Figure 5:
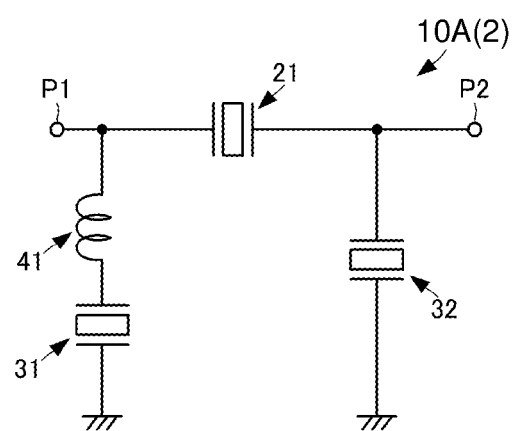

FIG. 5 is an equivalent circuit diagram of a high-frequency filter according to a second embodiment of the present disclosure in a second connection mode.

Figure 6:
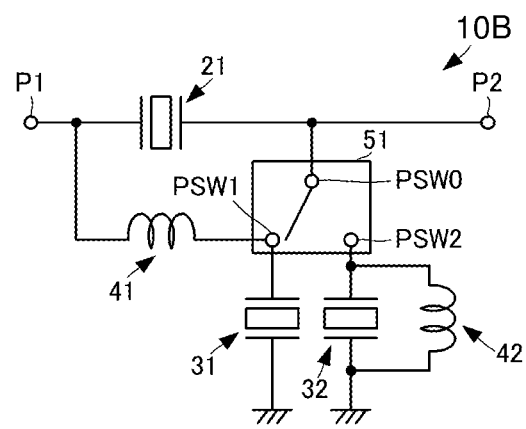

FIG. 6 is a circuit diagram of a high-frequency filter according to a third embodiment of the present disclosure.

Figure 7A:
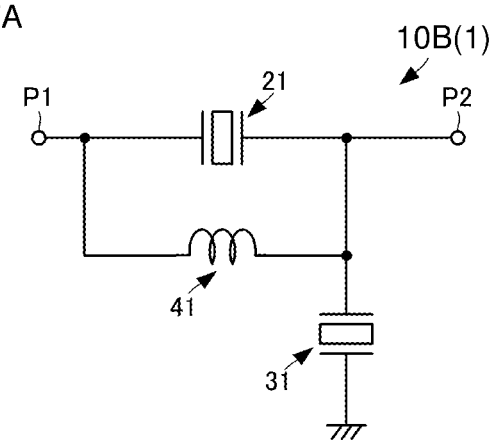
Figure 7B:
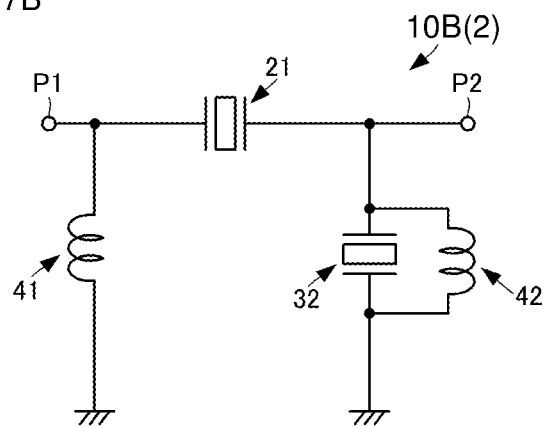

FIG. 7A is an equivalent circuit diagram of a high-frequency filter according to the third embodiment of the present disclosure in the first connection mode, FIG. 7B is an equivalent circuit diagram of a high-frequency filter according to the third embodiment of the present disclosure in the second connection mode.

Figure 8A:
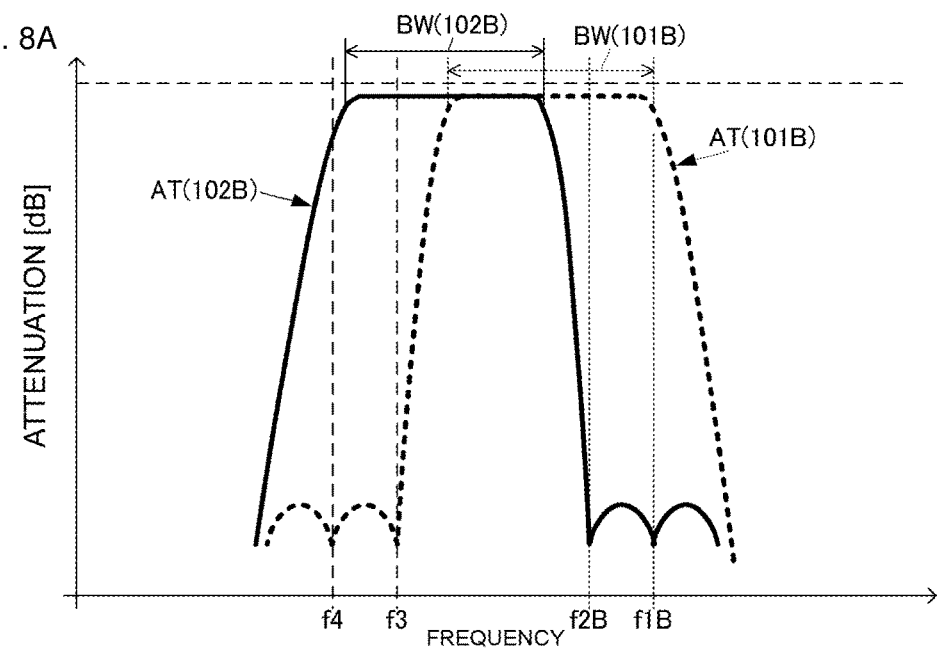
Figure 8B:
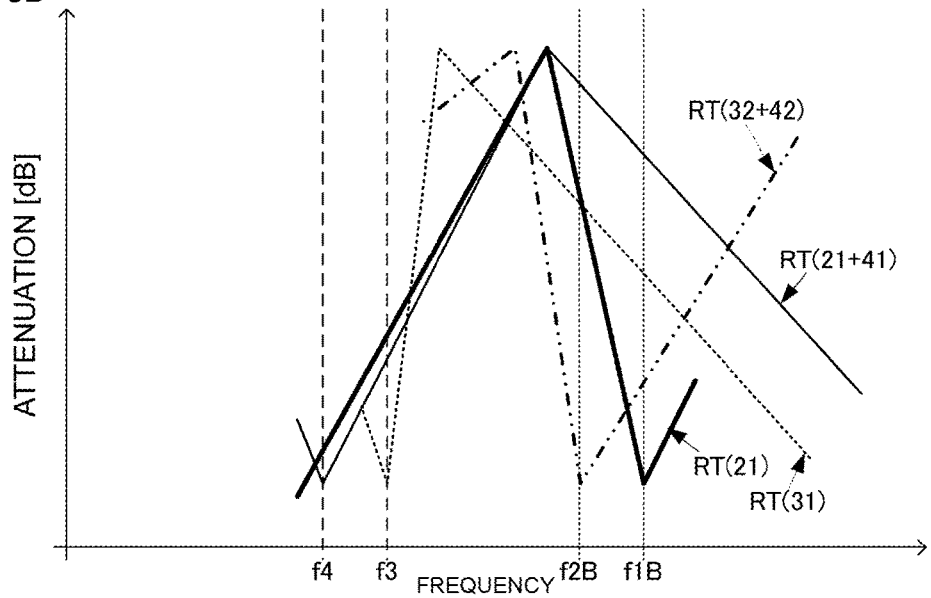

FIG. 8A is a graph indicating filter characteristics of a high-frequency filter according to the third embodiment of the present disclosure, and FIG. 8B is a graph indicating attenuation characteristics based on impedance characteristics of a resonator in a high-frequency filter according to the third embodiment of the present disclosure.

Figure 9:
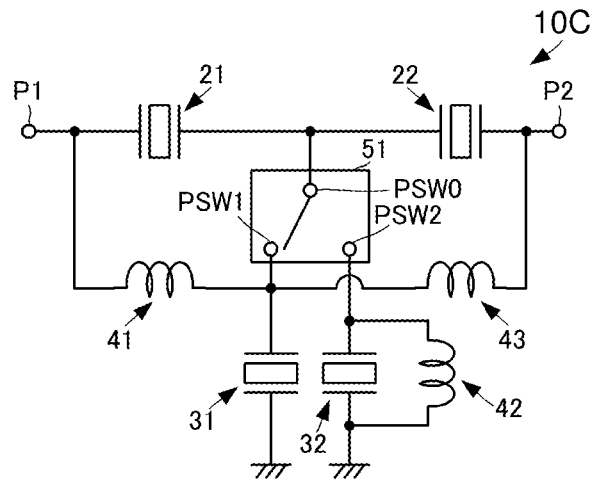

FIG. 9 is a circuit diagram of a high-frequency filter according to a fourth embodiment of the present disclosure.

Figure 10A:
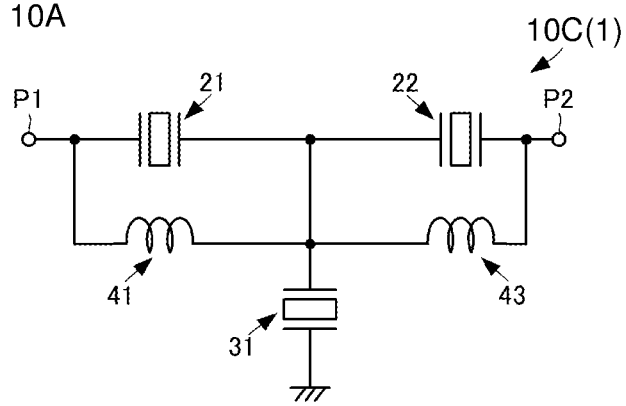
Figure 10B:
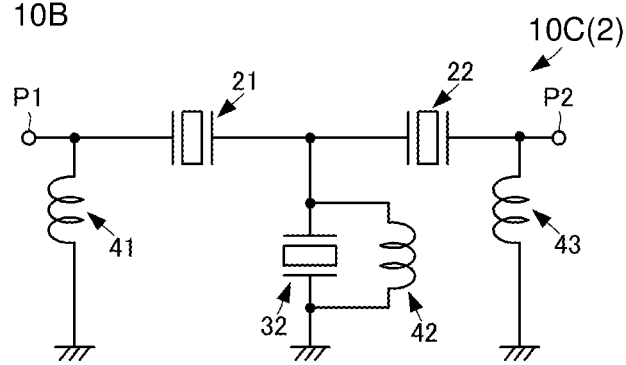

FIG. 10A is an equivalent circuit diagram of a high-frequency filter according to the fourth embodiment of the present disclosure in the first connection mode, and FIG. 10B is an equivalent circuit diagram of a high-frequency filter according to the fourth embodiment of the present disclosure in the second connection mode.

Figure 11A:
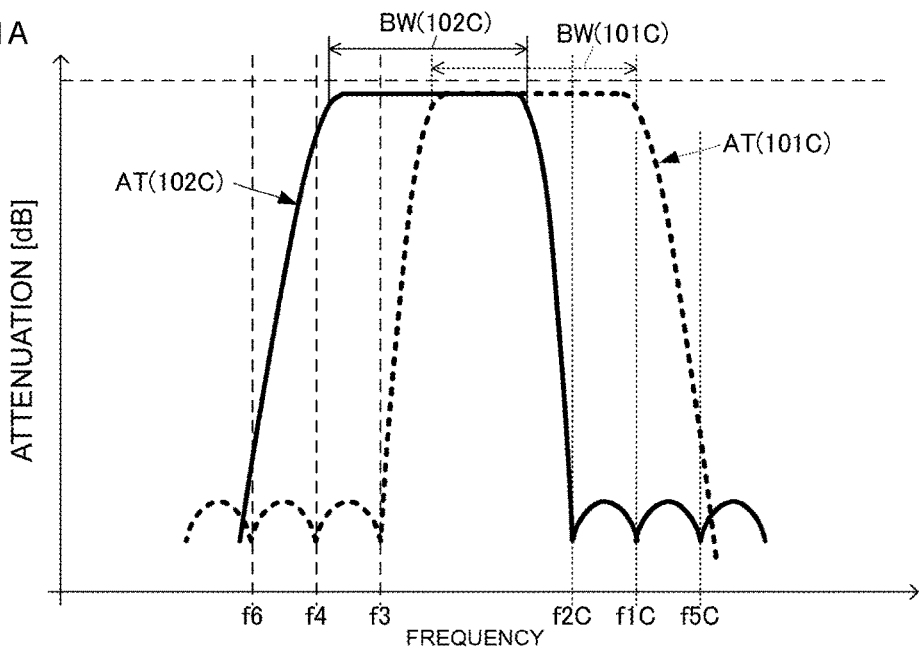
Figure 11B:
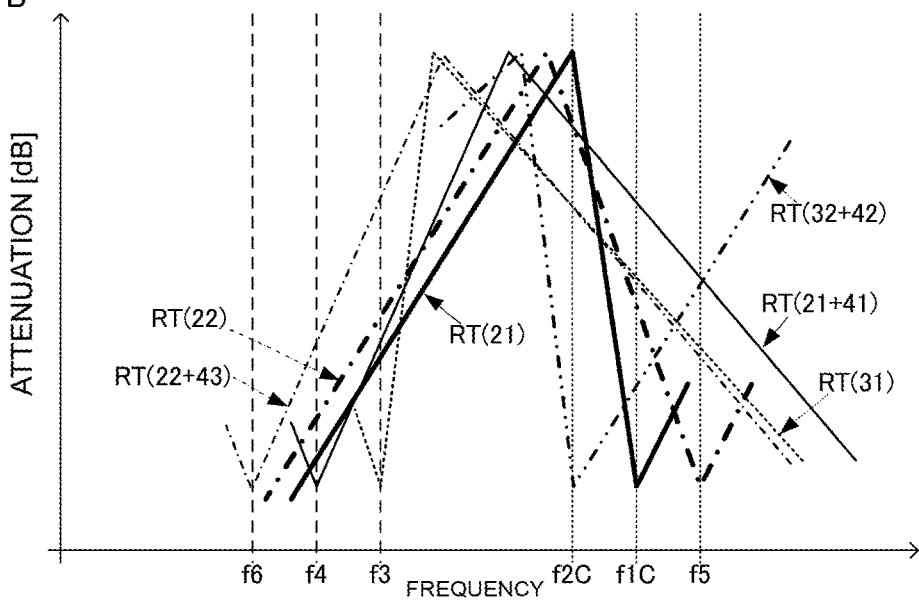

FIG. 11A is a graph indicating filter characteristics of a high-frequency filter according to the fourth embodiment of the present disclosure, and FIG. 11B is a graph indicating attenuation characteristics based on impedance characteristics of a resonator in a high-frequency filter according to the fourth embodiment of the present disclosure.

Figure 12:
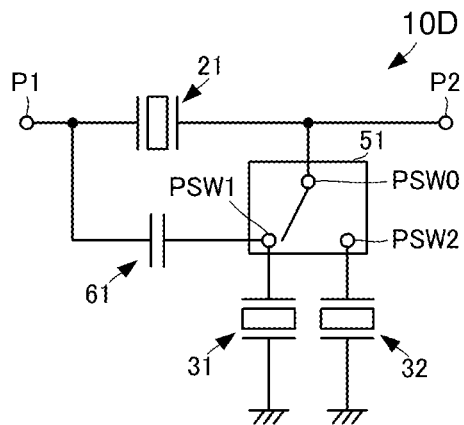

FIG. 12 is a circuit diagram of a high-frequency filter according to a fifth embodiment of the present disclosure.

Figure 13A:
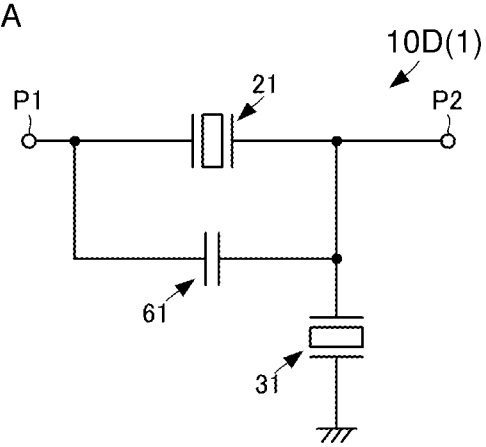
Figure 13B:
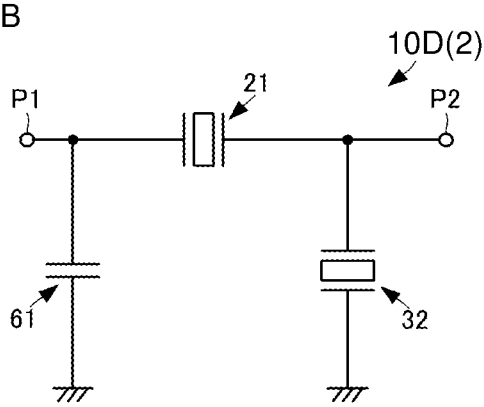

FIG. 13A is an equivalent circuit diagram of a high-frequency filter according to the fifth embodiment of the present disclosure in the first connection mode, and FIG. 13B is an equivalent circuit diagram of a high-frequency filter according to the fifth embodiment of the present disclosure in the second connection mode.

Figure 14:
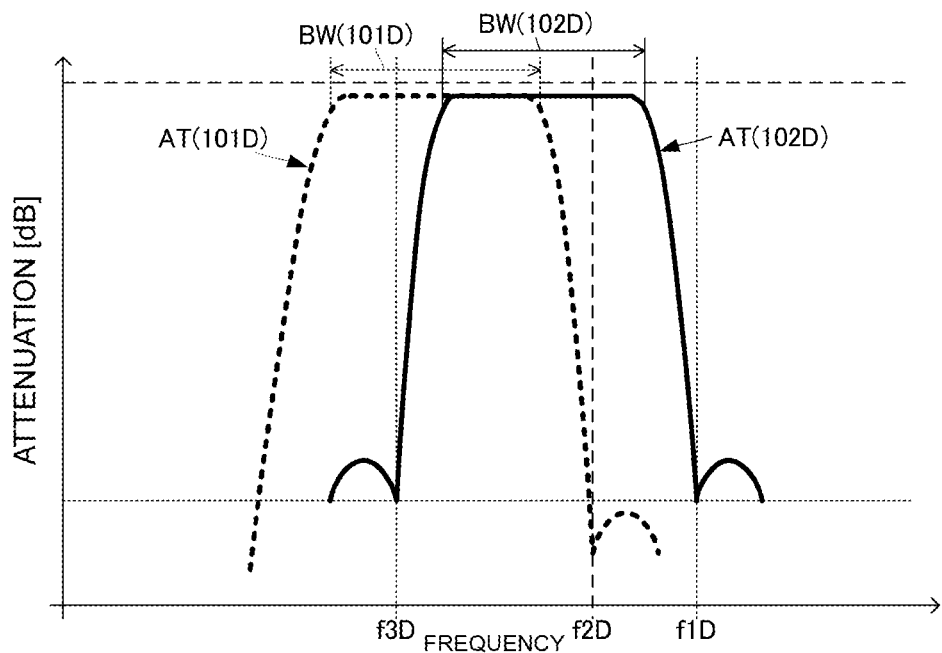

FIG. 14 is a graph indicating filter characteristics of a high-frequency filter according to the fifth embodiment of the present disclosure.

Figure 15:
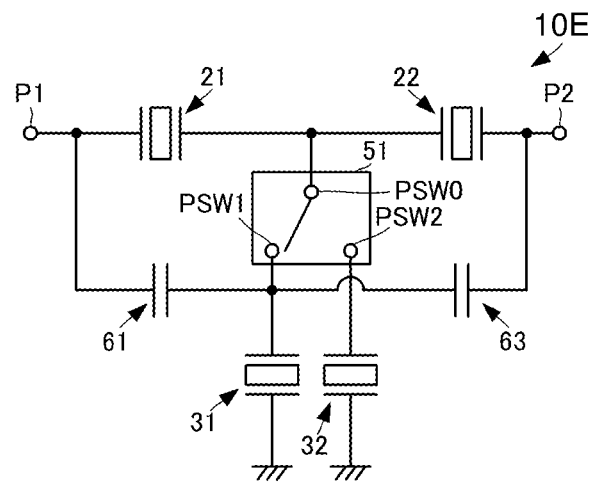

FIG. 15 is a circuit diagram of a high-frequency filter according to the sixth embodiment of the present disclosure.

Figure 16:
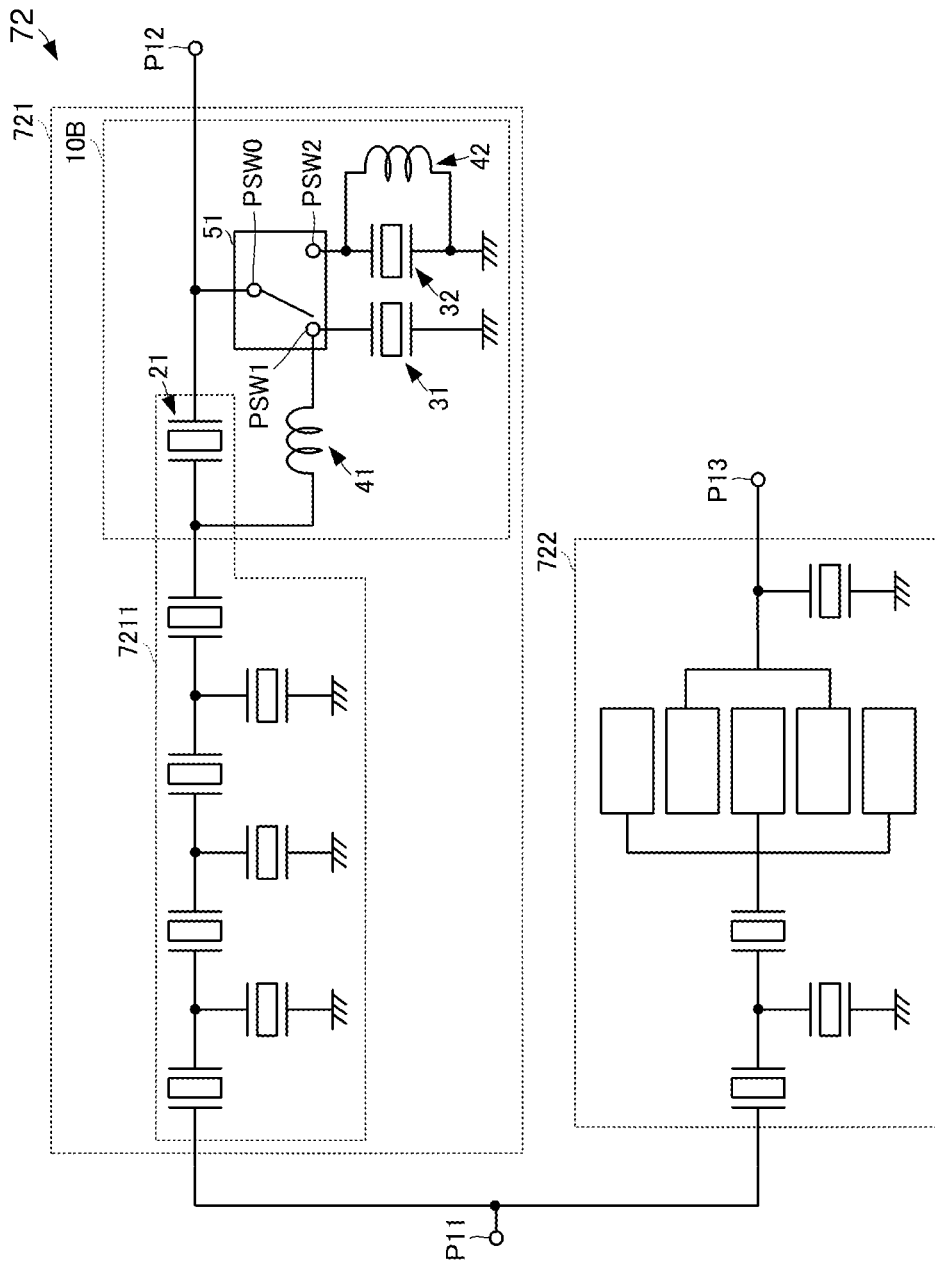

FIG. 16 is a circuit diagram of a branching circuit according to a seventh embodiment of the present disclosure.

Figure 17:
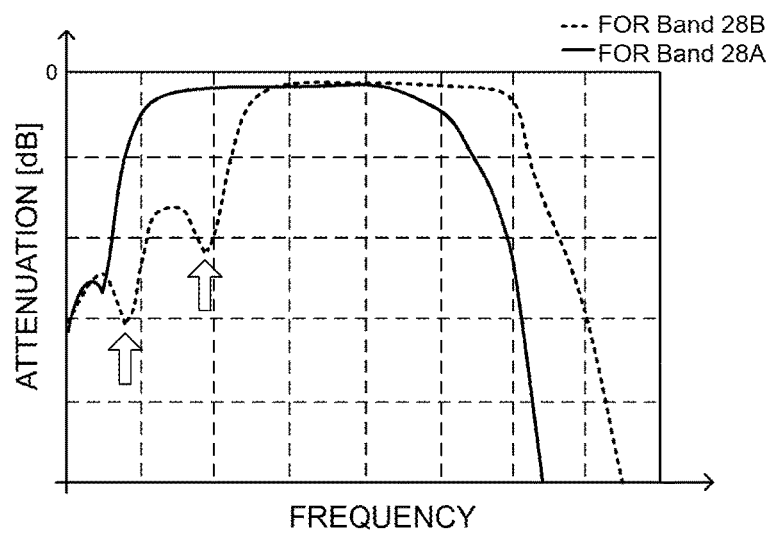

FIG. 17 is a graph indicating filter characteristics of a transmission filter in a branching circuit according to the seventh embodiment of the present disclosure.

Figure 18:
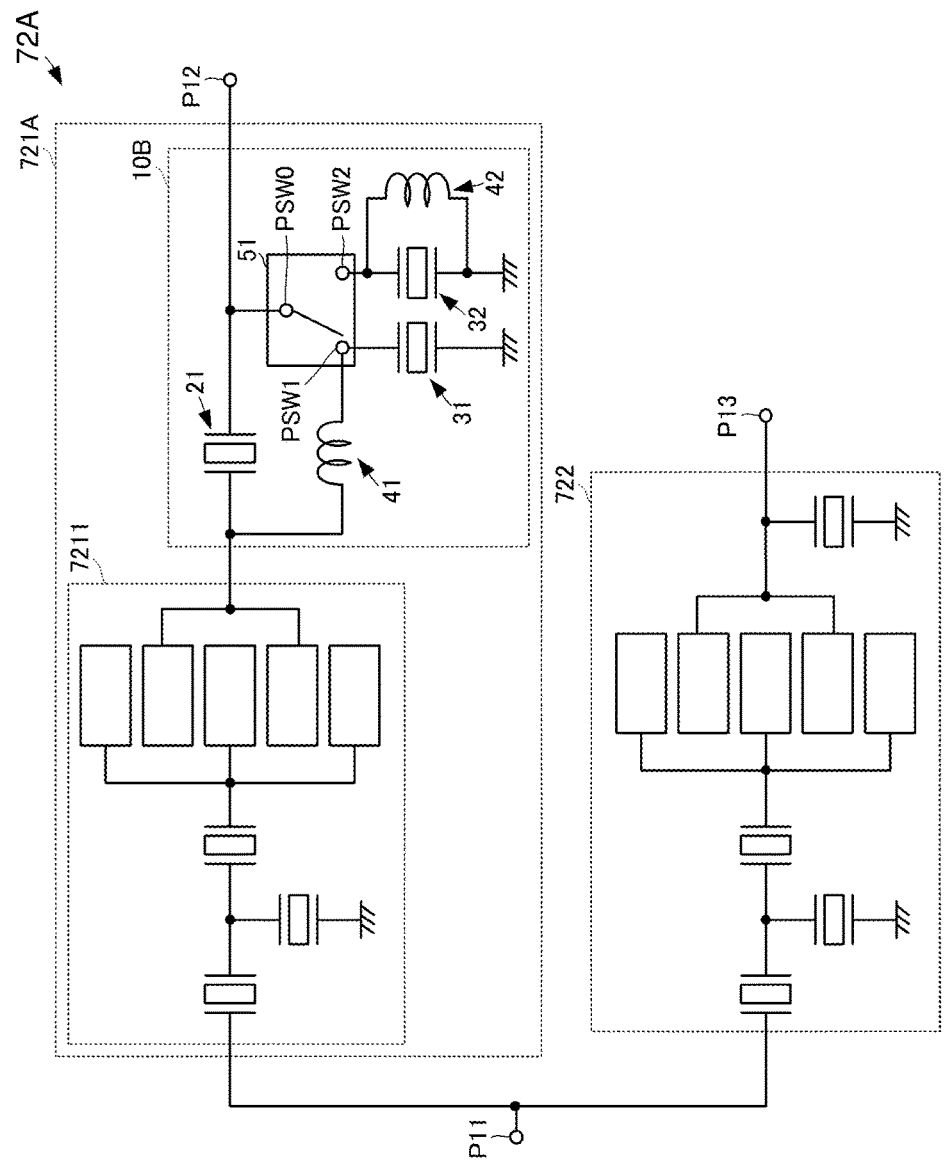

FIG. 18 is a circuit diagram of a branching circuit according to an eighth embodiment of the present disclosure.

Figure 19:
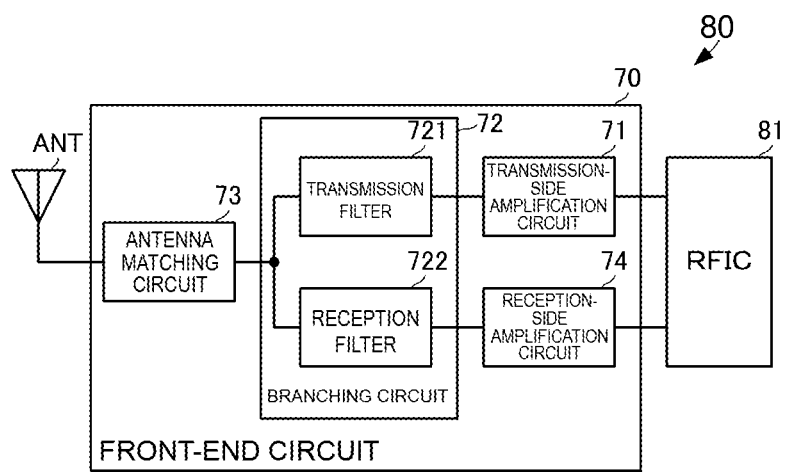

FIG. 19 is a functional block diagram of a communication apparatus according to a ninth embodiment of the present disclosure.

DETAILED DESCRIPTION OF THE DISCLOSURE

A high-frequency filter according to the first embodiment of the present disclosure will be described with reference to the accompanying drawings. FIG. 1 is a circuit diagram of a high-frequency filter according to the first embodiment of the present disclosure. Each of FIGS. 2A and 2B is an equivalent circuit diagram of a switch in a high-frequency filter according to the first embodiment of the present disclosure. FIG. 3A is an equivalent circuit diagram of a high-frequency filter according to the first embodiment of the present disclosure in a first connection mode. FIG. 3B is an equivalent circuit diagram of a high-frequency filter according to the first embodiment of the present disclosure in a second connection mode. FIG. 4A is a graph indicating filter characteristics of a high-frequency filter according to the first embodiment of the present disclosure. FIG. 4B is a graph indicating attenuation characteristics based on the impedance characteristics of a resonator in a high-frequency filter according to the first embodiment of the present disclosure.

As illustrated in FIG. 1, a high-frequency filter 10 includes a resonator 21 (a "first resonator" according to the present disclosure), a resonator 31 (a "second resonator" according to the present disclosure), a resonator 32 (a "third resonator" according to the present disclosure), an inductor 41 (a "first reactance element" according to the present disclosure), and a switch 51. Each of the resonators 21, 31, and 32 has a resonant point (a resonant frequency) and an anti-resonant point (an anti-resonant frequency), and is, for example, a piezoelectric resonator. The resonant points and anti-resonant points of the resonators 21, 31, and 32 are set as appropriate on the basis of the desired filter characteristics of the high-frequency filter 10.

The switch 51 is an SPDT switch including terminals PSW0, PSW1, and PSW2. The terminal PSW0 is selectively connected to the terminal PSW1 or the terminal PSW2. More specifically, as illustrated in FIGS. 2A and 2B, the switch 51 includes four SPST switches. One ends of the SPST switches F1 and F2 are connected to the terminal PSW0. The other end of the SPST switch F1 is connected to the terminal PSW1 and one end of a SPST switch F3. The other end of the SPST switch F3 is connected to the ground. The other end of the SPST switch F2 is connected to the terminal PSW2 and one end of an SPST switch F4. The other end of the SPST switch F4 is connected to the ground. As illustrated in FIG. 2A, when the SPST switches F1 and F4 are conducting, the SPST switches F2 and F3 are open. As illustrated in FIG. 2B, when the SPST switches F1 and F4 are open, the SPST switches F2 and F3 are conducting. In the switch 51, when the terminals PSW0 and PSW1 are conducting, the terminal PSW2 is not connected to the terminal PSW0 and is connected to the ground. When the terminals PSW0 and PSW2 are conducting, the terminal PSW1 is not connected to the terminal PSW0 and is connected to the ground.

The resonator 21 is connected between a first input/output terminal P1 and a second input/output terminal P2. One end of the inductor 41 is connected to the first input/output terminal P1. That is, one end of the inductor 41 is connected to a terminal of the resonator 21 on the side of the first input/output terminal P1.

The terminal PSW0 of the switch 51 is connected to the second input/output terminal P2. That is, the terminal PSW0 of the switch 51 is connected to a terminal of the resonator 21 on the side of the second input/output terminal P2.

The terminal PSW1 of the switch 51 is connected to the other end of the inductor 41. The terminal PSW1 of the switch 51 is further connected to one end of the resonator 31. The other end of the resonator 31 is connected to the ground.

The terminal PSW2 of the switch 51 is connected to one end of the resonator 32. The other end of the resonator 32 is connected to the ground.

When the connection mode of the switch 51 is changed in the above-described configuration, the high-frequency filter 10 functions as one of two types of circuits illustrated in FIGS. 3A and 3B.

[Connection Mode 1]

In the high-frequency filter 10 (1) in the connection mode 1, the terminal PSW0 is connected to the terminal PSW1. A circuit configuration in the connection mode 1 is as illustrated in FIG. 3A. Specifically, a parallel circuit including the resonator 21 and the inductor 41 is connected between the first input/output terminal P1 and the second input/output terminal P2. One end of this parallel circuit on the side of the second input/output terminal P2 is connected to the ground via the resonator 31. In this configuration, the inductor 41 operates as a so-called extension L (inductor) for the resonator 21.

With this circuit configuration, the filter characteristics AT (101) represented by a broken line in FIG. 4A are obtained. Specifically, the filter characteristics AT (101) have a passband BW (101) and attenuation bands on the higher-frequency side and lower-frequency side of the passband BW (101). The passband BW (101) includes a frequency near the resonant point of the parallel circuit including the resonator 21 and the inductor 41, a frequency band on the higher-frequency side of the resonant point, and a frequency band on a higher-frequency side of the anti-resonant point of the resonator 31.

More specifically, an end portion (a lower limit frequency) of the passband BW (101) on the lower-frequency side is determined on the basis of the anti-resonant point of the resonator 31 which is on the lower-frequency side of the resonant point of the parallel circuit including the resonator 21 and the inductor 41. The higher-frequency side of the lower limit frequency of the passband BW (101) is determined on the basis of the characteristics of the parallel circuit including the resonator 21 and the inductor 41 and the characteristics of the resonator 31.

In the filter characteristics AT (101), there are two attenuation poles on the lower-frequency side of the passband BW (101). The attenuation poles are determined on the basis of a frequency f3 that is the resonant point of the resonator 31 and a frequency f4 that is the anti-resonant point of the parallel circuit including the resonator 21 and the inductor 41, respectively.

As is apparent from the impedance characteristics of the resonator 31 illustrated in FIG. 4B, the resonant point and anti-resonant point of the resonator 31 are close to each other and the frequency f3, which is the resonant point of the resonator 31, is close to the lower limit frequency of the passband BW (101). On the lower-frequency side of the passband BW (101), steep attenuation characteristics can therefore be realized and an attenuation pole can be obtained at the frequency f3.

As described above, the inductor 41 functions as an extension inductor for the resonator 21. The frequency f4, which is the anti-resonant point (secondary anti-resonant point) of the parallel circuit including the resonator 21 and the inductor 41, is close to the resonant point of the resonator 31. The frequency f4, which is the anti-resonant point (secondary anti-resonant point) of the parallel circuit including the resonator 21 and the inductor 41, can therefore be close to the frequency f3 that is the resonant point of the resonator 31. Near the attenuation pole at the frequency f3, the attenuation pole at the frequency f4 can therefore be further obtained.

Thus, in the connection mode 1, the filter characteristics AT (101) having steep attenuation characteristics on the lower-frequency side of the passband BW (101) with two attenuation poles can be realized. With the two attenuation poles, the amount of attenuation can be increased on the lower-frequency side of the passband BW (101). In a frequency band close to the lower-frequency side of the passband BW (101), isolation can therefore be established with more certainty.

[Connection Mode 2]

In the high-frequency filter 10 (2) in the connection mode 2, the terminal PSW0 is connected to the terminal PSW2. The terminal PSW1 is connected to the ground. A circuit configuration in the connection mode 2 is as illustrated in FIG. 3B. Specifically, the resonator 21 is connected between the first input/output terminal P1 and the second input/output terminal P2. One end of the resonator 21 on the side of the first input/output terminal P1 is connected to the ground via the inductor 41. The other end of the resonator 21 on the side of the second input/output terminal P2 is connected to the ground via the resonator 32. In this configuration, the inductor 41 operates, on the side of the first input/output terminal P1, as a matching circuit for a circuit including the resonators 21 and 32. That is, the inductor 41 is not a primary element in determining filter characteristics.

With this circuit configuration, filter characteristics AT (102) represented by a solid line in FIG. 4A are obtained. Specifically, the filter characteristics AT (102) have a passband BW (102) and an attenuation band on the higher-frequency side and lower-frequency side of the passband BW (102). The passband BW (102) is located on the lower-frequency side of the passband BW (101) and partly overlaps the passband BW (101).

The passband BW (102) includes a frequency band on the higher-frequency side of the anti-resonant point of the resonator 32 and a frequency band on the lower-frequency side of the resonant point of the resonator 21.

More specifically, the end portion (lower limit frequency) of the passband BW (102) on the lower-frequency side is determined on the basis of the anti-resonant point of the resonator 32. The end portion (upper limit frequency) of the passband BW (102) on the higher-frequency side is determined by the resonator 21.

In the filter characteristics AT (102), there is a single attenuation pole on the lower-frequency side of the passband BW (102) and a single attenuation pole on the higher-frequency side of the passband BW (102). The attenuation pole on the lower-frequency side is at a frequency f2 that is the resonant point of the resonator 32. The attenuation pole on the higher-frequency side is at a frequency f1 that is the anti-resonant point of the resonator 21.

An extension inductor is not provided for each of the resonators 21 and 32, and the anti-resonant point and resonant point of each of the resonators 21 and 32 are close to each other. As a result, steep attenuation characteristics due to the characteristics of the resonator 32 can be realized on the lower-frequency side of the passband BW (102), and an attenuation pole can be obtained at the frequency f2. In addition, steep attenuation characteristics due to the characteristics of the resonator 21 can be realized on the higher-frequency side of the passband BW (102), and an attenuation pole can be obtained at the frequency f1.

Thus, in the connection mode 2, the filter characteristics AT (102) in which steep attenuation characteristics are obtained on the lower-frequency side and higher-frequency side of the passband BW (102) can be realized. In the characteristics, attenuation poles can be obtained on both the lower-frequency side and higher-frequency side of the passband BW (102). As a result, in both frequency bands close to the lower-frequency side and higher-frequency side of the passband BW (102), isolation can be established.

As described above, using a configuration according to this embodiment, isolation can be established in a frequency band close to the lower-frequency side and/or higher-frequency side of the passband BW with more certainty. That is, using a configuration according to this embodiment, two types of filter characteristics having different passbands and different attenuation characteristics can be realized. In these filter characteristics, by setting the inductor 41 as a selection target of the switch 51 for performing switching between resonators, the selection of a function of the inductor 41 as well as the switching between resonators can be performed. A small circuit configuration can therefore be realized.

Two attenuation poles can be formed with a single switch. As compared with a configuration in which a combination of a plurality of resonators is changed by a switch, a greater variety of filter characteristics can be realized with a smaller circuit configuration.

A high-frequency filter according to this embodiment is useful for using the communication band Band 28 in the communication standard 3GPP2. In the communication band Band 28, a plurality of communication bands, the Band 28A and the Band 28B, are set. The frequency band of the communication band Band 28A and the frequency band of the communication band Band 28B partly overlap.

Specifically, the transmission frequency band of the communication band Band 28 ranges from 703 [MHz] to 748 [MHz]. The transmission frequency band of the communication band Band 28A ranges from 703 [MHz] to 733 [MHz], and the transmission frequency band of the communication band Band 28B ranges from 718 [MHz] to 748 [MHz].

The transmission frequency band of the communication band Band 28 overlaps a digital television (DTV) broadcasting frequency band, and is subject to spurious emission regulation. Specifically, the communication band Band 28A is subject to the "NS17" spurious emission regulation in 3GGP2, and cannot be used in a DTV broadcasting area where this regulation is applied. In this broadcasting area, the communication band Band 28B is used for communication. In this case, a communication terminal needs to not only pass a Band 28B transmission signal with a low loss, but also comply with the "NS17" spurious emission regulation set for the frequency band of the communication band Band 28A.

On the other hand, in an area other than this broadcasting area, the communication band Band 28A can be used. That is, the entire frequency band of the communication band Band 28 can be used. However, near the lower-frequency side of the communication band Band 28, another spurious emission regulation "NS18" is set. In this case, a communication terminal needs to not only pass a Band 28 transmission signal with a low loss, but also comply with the "NS18" spurious emission regulation set near the lower-frequency side of the communication band Band 28.

In such a case, by using the high-frequency filter 10 according to this embodiment and selecting the connection mode 1, it is possible to perform communication in the communication band Band 28B while complying with the "NS17" spurious emission regulation. In addition, by selecting the connection mode 2, it is possible to perform communication in the communication band Band 28A while complying with the "NS18" spurious emission regulation.

Thus, it is possible to perform filter processing in both the communication band Band 28A and the communication band Band 28B with a single high-frequency filter, the high-frequency filter 10.

Next, a high-frequency filter according to a second embodiment of the present disclosure will be described with reference to the accompanying drawing. FIG. 5 is an equivalent circuit diagram of a high-frequency filter according to the second embodiment of the present disclosure in the second connection mode.

A high-frequency filter 10A according to this embodiment differs from the high-frequency filter 10 according to the first embodiment in the configuration of the switch 51. A terminal that is not selected by the switch 51 in the high-frequency filter 10A, that is, the terminal PSW2 in a state where the terminal PSW1 is connected to the terminal PSW0 or the terminal PSW1 in a state where the terminal PSW2 is connected to the terminal PSW0, is not connected to the ground.

In the connection mode 1, the high-frequency filter 10A has the same circuit configuration as the high-frequency filter 10 according to the first embodiment. In this configuration, the inductor 41 functions as an extension inductor connected in parallel to the resonator 21.

In the connection mode 2, the resonator 21 is connected between the first input/output terminal P1 and the second input/output terminal P2 in the high-frequency filter 10A. One end of the resonator 21 on the side of the first input/output terminal P1 is connected to the ground via a series circuit including the inductor 41 and the resonator 31. The other end of the resonator 21 on the side of the second input/output terminal P2 is connected to the ground via the resonator 32. In this configuration, the inductor 41 functions as an extension inductor connected in series to the resonator 31.

Thus, even in a case where a terminal that is not selected by a switch is not connected to the ground, the switch can change the function thereof as well as the combination of resonators.

Next, a high-frequency filter according to a third embodiment of the present disclosure will be described with reference to the accompanying drawings. FIG. 6 is a circuit diagram of a high-frequency filter according to the third embodiment of the present disclosure. FIG. 7A is an equivalent circuit diagram of a high-frequency filter according to the third embodiment of the present disclosure in the first connection mode. FIG. 7B is an equivalent circuit diagram of a high-frequency filter according to the third embodiment of the present disclosure in the second connection mode. FIG. 8A is a graph indicating filter characteristics of a high-frequency filter according to the third embodiment of the present disclosure. FIG. 8B is a graph indicating attenuation characteristics based on impedance characteristics of a resonator in a high-frequency filter according to the third embodiment of the present disclosure.

As illustrated in FIG. 6, a high-frequency filter 10B according to this embodiment differs from the high-frequency filter 10 according to the first embodiment in that an inductor (a "second reactance element" according to the present disclosure) is added.

The inductor 42 is connected in parallel to the resonator 32.

When the connection mode of the switch 51 is changed, the high-frequency filter 10B functions as one of two types of circuits illustrated in FIGS. 7A and 7B.

[Connection Mode 1]

As illustrated in FIG. 7A, the high-frequency filter 10B (1) in the connection mode 1 has the same circuit configuration as the high-frequency filter 10 (1) according to the first embodiment. As illustrated in FIG. 8A, filter characteristics AT (101B) of the high-frequency filter 10B (1) are therefore the same as filter characteristics AT (101) of the high-frequency filter 10 (1).

[Connection Mode 2]

In the high-frequency filter 10B (2) in the connection mode 2, the inductor 42 operates as a so-called extension L (inductor) for the resonator 32.

With this circuit configuration, filter characteristics AT (102B) represented by a solid line in FIG. 8A are obtained. Specifically, the filter characteristics AT (102B) have a passband BW (102B) and two attenuation bands on the higher-frequency side of the passband BW (102B). The passband BW (102B) includes a frequency band on the lower-frequency side of the resonant point of the resonator 21 and a frequency band on the lower-frequency side of the anti-resonant point of a parallel circuit including the resonator 32 and the inductor 42.

More specifically, the end portion (upper limit frequency) of the passband BW (102B) on the higher-frequency side is determined on the basis of the resonant point of the resonator 21. The lower-frequency side of the upper limit frequency of the passband BW (102B) is determined on the basis of the characteristics of the resonator 21 and the characteristics of a parallel circuit including the resonator 32 and the inductor 42.

The filter characteristics AT (102B) have two attenuation poles on the higher-frequency side of the passband BW (102B). The attenuation poles are determined on the basis of a frequency f1B that is the anti-resonant point of the resonator 21 and a frequency f2B that is the resonant point of a parallel circuit including the resonator 32 and the inductor 42, respectively.

As is apparent from the impedance characteristics of the resonator 21 illustrated in FIG. 8B, the resonant point and anti-resonant point of the resonator 21 are close to each other and the frequency f1B, which is the anti-resonant point of the resonator 21, is close to the upper limit frequency of the passband BW (102B). On the higher-frequency side of the passband BW (102B), steep attenuation characteristics can therefore be realized and an attenuation pole can be obtained at the frequency f1B.

As described above, the inductor 42 functions as an extension inductor for the resonator 32. The frequency f2B, which is the resonant point of the parallel circuit including the resonator 32 and the inductor 42, is close to the anti-resonant point of the resonator 21 on the lower-frequency side of the anti-resonant point of the resonator 21. The frequency f2B, which is the resonant point of the parallel circuit including the resonator 32 and the inductor 42, can therefore be close to the frequency f1B that is the anti-resonant point of the resonator 21. Near the attenuation pole at the frequency f1B, the attenuation pole at the frequency f2B can therefore be further obtained.

Thus, in the connection mode 2, the filter characteristics AT (102B) having steep attenuation characteristics on the higher-frequency side of the passband BW (102B) with two attenuation poles can be realized. With the two attenuation poles, the amount of attenuation can be increased on the higher-frequency side of the passband BW (102B). In a frequency band close to the higher-frequency side of the passband BW (102B), isolation can therefore be established with more certainty.

Thus, using the high-frequency filter 10B according to this embodiment, high isolation can be established on the side of the communication band BW (102B) in the communication band BW (101B) and high isolation can be established on the side of the communication band BW (101B) in the communication band BW (102B). Between communication bands using two passbands that are close to each other, higher isolation can be established using the high-frequency filter 10B. This configuration is more useful for an exemplary case where transmission and reception are performed in both the Bands 28A and 28B in the 3GS communication standard.

Next, a high-frequency filter according to a fourth embodiment of the present disclosure will be described with reference to the accompanying drawings. FIG. 9 is a circuit diagram of a high-frequency filter according to the fourth embodiment of the present disclosure. FIG. 10A is an equivalent circuit diagram of a high-frequency filter according to the fourth embodiment of the present disclosure in the first connection mode. FIG. 10B is an equivalent circuit diagram of a high-frequency filter according to the fourth embodiment of the present disclosure in the second connection mode. FIG. 11A is a graph indicating filter characteristics of a high-frequency filter according to the fourth embodiment of the present disclosure. FIG. 11B is a graph indicating attenuation characteristics based on impedance characteristics of a resonator in a high-frequency filter according to the fourth embodiment of the present disclosure.

A high-frequency filter 10C according to this embodiment differs from the high-frequency filter 10B according to the third embodiment in that a resonator 22 (a "fourth resonator" according to the present disclosure) and an inductor 43 (a "third reactance element" according to the present disclosure) are added.

The resonator 22 is connected between the second input/output terminal P2 and a node between the resonator 21 and the switch 51. One end of the inductor 43 is connected to the second input/output terminal P2. That is, one end of the inductor 43 is connected to one end of the resonator 22 on the side of the second input/output terminal P2. The other end of the inductor 43 is connected to the terminal PSW1 of the switch 51. That is, the other end of the inductor 43 is connected to the inductor 41 and the resonator 31.

The characteristics of the resonators 21, 22, 31, and 32 and the inductances of the inductors 41, 42, and 43 are set as appropriate to realize the following two types of filter characteristics.

When the connection mode of the switch 51 is changed in the above-described configuration, the high-frequency filter 10C functions as one of two types of circuits illustrated in FIGS. 10A and 10B.

[Connection Mode 1]

As illustrated in FIG. 10A, the high-frequency filter 10C (1) in the connection mode 1 includes a first parallel circuit including the resonator 21 and the inductor 41 and a second parallel circuit including the resonator 22 and the inductor 43. The first parallel circuit and the second parallel circuit are connected in series between the first input/output terminal P1 and the second input/output terminal P2. A node between the first parallel circuit and the second parallel circuit is connected to the ground via the resonator 31. In this configuration, the inductor 41 functions as an extension inductor for the resonator 21. The inductor 43 functions as an extension inductor for the resonator 22.

With the above-described configuration, the high-frequency filter 10C (1) can have filter characteristics AT (101C) illustrated in FIG. 11A. The filter characteristics AT (101C) have a passband BW (101C) and three attenuation poles (frequencies f3, f4, and f6) on the lower-frequency side of the passband BW (101C). Like in the above-described embodiments, the passband BW (101C) and the frequencies f3, f4, and f6 are determined on the basis of the characteristics of the first parallel circuit including the resonator 21 and the inductor 41, the characteristics of the second parallel circuit including the resonator 22 and the inductor 43, and the characteristics of the resonator 31 as illustrated in FIG. 11B.

[Connection Mode 2]

The high-frequency filter 10C (2) in the connection mode 2 includes the resonators 21 and 22 and a third parallel circuit including the resonator 32 and the inductor 42 as illustrated in FIG. 10B. The resonators 21 and 22 are connected in series between the first input/output terminal P1 and the second input/output terminal P2. A node between the resonators 21 and 22 is connected to the ground via the third parallel circuit. In this configuration, the inductor 41 functions as a matching circuit on the side of the first input/output terminal P1 in the high-frequency filter 10C (2). The inductor 43 functions as a matching circuit on the side of the second input/output terminal P2 in the high-frequency filter 10C (2).

With this configuration, the high-frequency filter 10C (2) can have filter characteristics AT (102C) illustrated in FIG. 11A. The filter characteristics AT (102C) have a passband BW (102C). The passband BW (102C) is on the lower-frequency side of the passband BW (101C) and partly overlaps the passband BW (101C). The filter characteristics AT (102C) have three attenuation poles (frequencies f1C, f2C, and f5) on the higher-frequency side of the passband BW (102C). Like in the above-described embodiments, the passband BW (102C) and the frequencies f1C, f2C, and f5 are determined on the basis of the characteristics of the resonators 21 and 22 and the characteristics of the third resonant circuit including the resonator 32 and the inductor 42 as illustrated in FIG. 11B.

Thus, using the high-frequency filter 10C according to this embodiment, higher isolation can be established on the side of the communication band BW (102C) in the communication band BW (101C) and higher isolation can be established on the side of the communication band BW (101C) in the communication band BW (102C). Between communication bands using two passbands that are close to each other, higher isolation can be established using the high-frequency filter 10C. The increase in the number of adjacent attenuation poles in a frequency axis can broaden a frequency band in which a large amount of attenuation can be obtained. As a result, desired isolation can be realized with more certainty.

Next, a high-frequency filter according to a fifth embodiment of the present disclosure will be described with reference to the accompanying drawings. FIG. 12 is a circuit diagram of a high-frequency filter according to the fifth embodiment of the present disclosure. FIG. 13A is an equivalent circuit diagram of a high-frequency filter according to the fifth embodiment of the present disclosure in the first connection mode. FIG. 13B is an equivalent circuit diagram of a high-frequency filter according to the fifth embodiment of the present disclosure in the second connection mode. FIG. 14 is a graph indicating filter characteristics of a high-frequency filter according to the fifth embodiment of the present disclosure.

As illustrated in FIG. 12, a high-frequency filter 10D according to this embodiment differs from the high-frequency filter 10 according to the first embodiment in that the inductor 41 is replaced by a capacitor 61.

One end of the capacitor 61 is connected to the first input/output terminal P1. That is, one end of the capacitor 61 is connected to a terminal of the resonator 21 on the side of the first input/output terminal P1. The other end of the capacitor 61 is connected to the terminal PSW1 of the switch 51. The capacitor 61 corresponds to the "first reactance element" according to the present disclosure.

[Connection Mode 1]

In the high-frequency filter 10D (1) in the connection mode 1, the terminal PSW0 is connected to the terminal PSW1. A circuit configuration in the connection mode 1 is as illustrated in FIG. 13A. Specifically, a parallel circuit including the resonator 21 and the capacitor 61 is connected between the first input/output terminal P1 and the second input/output terminal P2. One end of this parallel circuit on the side of the second input/output terminal P2 is connected to the ground via the resonator 31. In this configuration, the capacitor 61 has a function of shifting the anti-resonant frequency of the resonator 21 to the lower-frequency side.

With this circuit configuration, filter characteristics AT (101D) represented by a broken line in FIG. 14 are obtained. Specifically, the filter characteristics AT (101D) have a passband BW (101D) and an attenuation band on the higher-frequency side of the passband BW (101D). The passband BW (101D) includes a frequency near the resonant point of the parallel circuit including the resonator 21 and the capacitor 61, a frequency band on the lower-frequency side of the resonant point, and a frequency band on a lower-frequency side of the anti-resonant point of the resonator 31.

More specifically, an end portion (upper limit frequency) of the passband BW (101D) on the higher-frequency side is determined on the basis of the resonant point of the parallel circuit including the resonator 21 and the capacitor 61 and the anti-resonant point of the resonator 31. The resonant point of the parallel circuit including the resonator 21 and the capacitor 61 and the anti-resonant point of the resonator 31 are substantially the same. The lower-frequency side of the upper limit frequency of the passband BW (101D) is determined on the basis of the characteristics of the parallel circuit including the resonator 21 and the capacitor 61 and the characteristics of the resonator 31.

The filter characteristics AT (101D) have a single attenuation pole on the higher-frequency side of the passband BW (101D). This attenuation pole is determined in accordance with a frequency f2D that is the frequency of an anti-resonant point of the parallel circuit including the resonator 21 and the capacitor 61. That is, the capacitor 61 shifts the anti-resonant point of the resonator 21 to determine the frequency f2D of the attenuation pole. A frequency obtained after the capacitor 61 has shifted the anti-resonant point of the resonator 21 is preferably substantially the same as the frequency of a resonant point of the resonator 31.

[Connection Mode 2]

In the high-frequency filter 10D (2) in the connection mode 2, the terminal PSW0 is connected to the terminal PSW2. The terminal PSW1 is connected to the ground. A circuit configuration in the connection mode 2 is as illustrated in FIG. 13B. Specifically, the resonator 21 is connected between the first input/output terminal P1 and the second input/output terminal P2. One end of the resonator 21 on the side of the first input/output terminal P1 is connected to the ground via the capacitor 61. The other end of the resonator 21 on the side of the second input/output terminal P2 is connected to the ground via the resonator 32. In this configuration, the capacitor 61 operates, on the side of the first input/output terminal P1, as a matching circuit for a circuit including the resonators 21 and 32. That is, the capacitor 61 is not a primary element in determining filter characteristics.

With this circuit configuration, filter characteristics AT (102D) represented by a solid line in FIG. 14 are obtained. Specifically, the filter characteristics AT (102D) have a passband BW (102D) and attenuation bands on the higher-frequency side and lower-frequency side of the passband BW (102D). The passband BW (102D) is located on the higher-frequency side of the passband BW (101D) and partly overlaps the passband BW (101D).

The passband BW (102D) includes a frequency band on the higher-frequency side of the anti-resonant point of the resonator 32 and a frequency band on the lower-frequency side of the resonant point of the resonator 21.

More specifically, the end portion (lower limit frequency) of the passband BW (102D) on the lower-frequency side is determined on the basis of the anti-resonant point of the resonator 32. The end portion (upper limit frequency) of the passband BW (102D) on the higher-frequency side is determined on the basis of the resonant point of the resonator 21.

The filter characteristics AT (102D) have a single attenuation pole on the lower-frequency side of the passband BW (102D) and a single attenuation pole on the higher-frequency side of the passband BW (102D). The attenuation pole on the lower-frequency side is at a frequency f3D that is the resonant point of the resonator 32. The attenuation pole on the higher-frequency side is at a frequency f1D that is the anti-resonant point of the resonator 21.

Even with this configuration, an operational effect similar to an operation effect of a high-frequency filter according to each of the above-described embodiments can be obtained. Also in the high-frequency filters according to the second, third, and fourth embodiments, desired filter characteristics can be obtained by replacing an inductor with a capacitor as appropriate.

Next, a high-frequency filter according to a sixth embodiment of the present disclosure will be described with reference to the accompanying drawing. FIG. 15 is a circuit diagram of a high-frequency filter according to the sixth embodiment of the present disclosure.

A high-frequency filter 10E according to this embodiment differs from the high-frequency filter 10C according to the fourth embodiment in that the inductors 41 and 43 are replaced by the capacitors 61 and 63, respectively and the inductor 42 is not present. That is, the high-frequency filter 10E differs from the high-frequency filter 10D according to the fifth embodiment in that the resonator 22 and the capacitor 63 are added.

The resonator 22 is connected between the second input/output terminal P2 and a node between the resonator 21 and the switch 51. One end of the capacitor 63 is connected to the second input/output terminal P2. That is, one end of the capacitor 63 is connected one end of the resonator 22 on the side of the second input/output terminal P2. The other end of the capacitor 63 is connected to the terminal PSW1 of the switch 51. That is, the other end of the capacitor 63 is connected to the capacitor 61 and the resonator 31. The capacitor 63 corresponds to the "third reactance element" according to the present disclosure.

Like a case where the inductor 41 in the high-frequency filter 10 according to the first embodiment is replaced by the capacitor 61 in the high-frequency filter 10D according to the fifth embodiment, the function of a capacitor can be changed on the basis of the connection mode of the capacitors 61 and 63 and various filter characteristics can be realized even with this configuration.

Next, a branching circuit according to a seventh embodiment of the present disclosure will be described with reference to the accompanying drawings. FIG. 16 is a circuit diagram of a branching circuit according to the seventh embodiment of the present disclosure.

As illustrated in FIG. 16, a branching circuit 72 includes a transmission filter 721 and a reception filter 722. The branching circuit 72 includes a common terminal P11, a transmission terminal P12, and a reception terminal P13. A transmission filter 721 is connected between the common terminal P11 and the transmission terminal P12. The reception filter 722 is connected between the common terminal P11 and the reception terminal P13. The common terminal P11 corresponds to a "first terminal" according to the present disclosure, and the transmission terminal P12 corresponds to a "second terminal" according to the present disclosure.

The transmission filter 721 is a circuit including the combination of a ladder resonant circuit 7211 in which a plurality of series arm resonators and a plurality of parallel arm resonators are connected in a ladder form and the high-frequency filter 10B according to the third embodiment. Specifically, the ladder resonant circuit 7211 and the high-frequency filter 10B are connected such that a resonator closest to the transmission terminal P12 in the ladder resonant circuit 7211 becomes the resonator 21 in the high-frequency filter 10B. This transmission filter also corresponds to a "high-frequency filter" according to the present disclosure.

The reception filter 722 includes the combination of a ladder resonant circuit and a longitudinally coupled resonant circuit. The ladder resonant circuit includes a plurality of series arm resonators and a plurality of parallel arm resonators which are connected in a ladder form. The longitudinally coupled resonant circuit includes a plurality of longitudinally coupled resonators.

The branching circuit 72 having the above-described configuration can support, for example, the communication band Band 28 in the communication standard 3GPP2.

Specifically, the transmission filter 721 in the branching circuit 72 realizes filter characteristics for the communication band Band 28B (corresponding to a second communication band) by bringing the terminal PSW0 and the terminal PSW1 (corresponding to a first selection target terminal) into conduction with the switch 51. On the other hand, the transmission filter 721 realizes filter characteristics for the communication band Band 28A (corresponding to a first communication band) by bringing the terminal PSW0 and the terminal PSW2 (corresponding to a second selection target terminal) into conduction with the switch 51.

FIG. 17 is a graph indicating filter characteristics of a transmission filter in a branching circuit according to the seventh embodiment of the present disclosure. As illustrated in FIG. 17, in a mode for the communication band Band 28B, two attenuation poles (represented by bold arrows in FIG. 17) can be formed on the lower-frequency side of the communication band Band 28B. As a result, the "NS17" spurious emission regulation can be complied with.

Next, a branching circuit according to an eighth embodiment of the present disclosure will be described with reference to the accompanying drawing. FIG. 18 is a circuit diagram of a branching circuit according to the eighth embodiment of the present disclosure.

A branching circuit 72A according to this embodiment differs from the branching circuit 72 according to the seventh embodiment in the configuration of a transmission filter 721A. The other configuration of the branching circuit 72A is the same as that of the branching circuit 72 according to the seventh embodiment, and the description thereof will be omitted.

The branching circuit 72A includes a transmission filter 721A. The transmission filter 721A includes a composite circuit 7211 and the high-frequency filter 10B which are connected in series. A composite circuit 7211 includes a ladder resonant circuit portion and a longitudinally coupled resonant circuit portion.

Even with this configuration, filter characteristics and an operational effect similar to those of the branching circuit 72 according to the seventh embodiment can be realized.

Next, a front-end circuit according to a ninth embodiment of the present disclosure and a communication apparatus according to the ninth embodiment will be described with reference to the accompanying drawing. FIG. 19 is a functional block diagram of a communication apparatus according to the ninth embodiment of the present disclosure.

A communication apparatus 80 includes a front-end circuit 70 and an RFIC 81. The front-end circuit 70 includes a transmission-side amplification circuit 71, a branching circuit 72, an antenna matching circuit 73, and a reception-side amplification circuit 74. The branching circuit 72 includes the transmission filter 721 and the reception filter 722. The transmission filter 721 and the reception filter 722 are connected to the antenna matching circuit 73. The antenna matching circuit 73 is connected to an antenna ANT. The transmission filter 721 is connected to the transmission-side amplification circuit 71. The reception filter 722 is connected to the reception-side amplification circuit 74. The transmission-side amplification circuit 71 and the reception-side amplification circuit 72 are connected to the RFIC 81.

The RFIC 81 generates a transmission signal using the frequency band of a specified communication band. The RFIC 81 outputs a switch control signal to the transmission filter 721 and the reception filter 722 which are included in the branching circuit 72 on the basis of the specified communication band. Each of the transmission filter 721 and the reception filter 722 is a high-frequency filter according to the respective above-described embodiments and performs switch control in accordance with the switch control signal.

A transmission signal output from the RFIC 81 is amplified the transmission-side amplification circuit 71. The transmission-side amplification circuit 71 includes, for example, a PA and amplifies a transmission signal. The amplified transmission signal is input into the transmission filter 721 in the branching circuit 72. The transmission signal is subjected to filter processing in the transmission filter 721 and is input into the antenna ANT via the antenna matching circuit 73. At that time, since the transmission filter 721 has the configuration of the above-described high-frequency filter, the transmission signal can be transmitted with a low lass and an unnecessary wave such as a harmonic generated in the transmission-side amplification circuit 71 can be attenuated with certainty no matter which of the communication band B28A and the communication band B28B is specified. As a result, an unnecessary high-frequency signal is not externally transmitted in a communication band other than the specified communication band and spurious emission regulation can be complied with.

A reception signal received by the antenna ANT is input into the reception filter 722 in the branching circuit 72 via the antenna matching circuit 73. The reception filter 722 performs filter processing upon the reception signal and outputs the reception signal to the reception-side amplification circuit 74. A reception-side amplification circuit 74 including, for example, an LNA amplifies the reception signal and outputs the reception signal to the RFIC 81.

With this configuration, the front-end circuit 70 and the communication apparatus 80 which are capable of performing low-loss communication in a specified communication band and complying with spurious emission regulation can be realized.

Each of the above-described embodiments partly contributes to realize the operational effect of the present disclosure. The combination of configurations according to the embodiments can also realize a similar operational effect. The present disclosure is not limited to the above-described embodiments. With a configuration in which the function of an inductor is changed using a switch for changing the combination of resonators in a filter circuit, the operational effect of the present disclosure can be realized.

10, 10A, 10B, 10C, 10D, and 10E high-frequency filter
21, 22, 31, and 32 resonator
41, 42, and 43 inductor
51 switch
61 and 63 capacitor
70 front-end circuit
71 transmission-side amplification circuit
72 branching circuit
73 antenna matching circuit
74 reception-side amplification circuit
81 RFIC
721 transmission filter
722 reception filter
ANT antenna
P1 first input/output terminal
P2 second input/output terminal
PSW0, PSW1, and PSW2 terminal of the switch 51

The invention claimed is:

1. A high-frequency filter comprising:
   a first resonator connected between a first input/output terminal and a second input/output terminal;
   a first reactance element having one end connected between the first resonator and the first input/output terminal;
   a second resonator having one end connected to another end of the first reactance element;
   a third resonator; and
   a switch configured to select either the third resonator or a connection portion connecting the first reactance element to the second resonator and connecting a selected one of the third resonator and the connection portion to a terminal of the first resonator on a side of the second input/output terminal.

2. The high-frequency filter according to claim 1, wherein the second resonator and the third resonator are connected to a ground.

3. The high-frequency filter according to claim 2, wherein the switch connects an unselected one of the third resonator and the connection portion to the ground.

4. The high-frequency filter according to claim 2, further comprising a second reactance element connected in parallel to the third resonator.

5. The high-frequency filter according to claim 2, further comprising:
   a fourth resonator connected between a connection portion connecting the first resonator to the switch and the second input/output terminal; and
   a third reactance element connected between a connection portion connecting the first reactance element to the second resonator and the second input/output terminal.

6. The high-frequency filter according to claim 2, wherein the first reactance element is an inductor.

7. The high-frequency filter according to claim 1, further comprising:
   a fourth resonator connected between a connection portion connecting the first resonator to the switch and the second input/output terminal; and
   a third reactance element connected between a connection portion connecting the first reactance element to the second resonator and the second input/output terminal.

8. The high-frequency filter according to claim 7, further comprising a second reactance element connected in parallel to the third resonator, wherein the first reactance element, the second reactance element, and the third reactance element are inductors.

9. The high-frequency filter according to claim 7, wherein the first reactance element and the third reactance element are capacitors.

10. The high-frequency filter according to claim 1, wherein the switch connects an unselected one of the third resonator and the connection portion to the ground.

11. The high-frequency filter according to claim 10, further comprising a second reactance element connected in parallel to the third resonator.

12. The high-frequency filter according to claim 10, further comprising:
    a fourth resonator connected between a connection portion connecting the first resonator to the switch and the second input/output terminal; and
    a third reactance element connected between a connection portion connecting the first reactance element to the second resonator and the second input/output terminal.

13. The high-frequency filter according to claim 1, further comprising a second reactance element connected in parallel to the third resonator.

14. The high-frequency filter according to claim 13, further comprising:
    a fourth resonator connected between a connection portion connecting the first resonator to the switch and the second input/output terminal; and
    a third reactance element connected between a connection portion connecting the first reactance element to the second resonator and the second input/output terminal.

15. The high-frequency filter according to claim 1, wherein the first reactance element is an inductor.

16. The high-frequency filter according to claim 1, wherein the first reactance element is a capacitor.

17. A front-end circuit comprising:
    a branching circuit including a transmission filter for performing filter processing upon a transmission signal and a reception filter for performing filter processing upon a reception signal;
    a transmission-side amplification circuit connected to the transmission filter; and
    a reception-side amplification circuit connected to the reception filter,
    wherein at least one of the transmission filter and the reception filter is the high-frequency filter according to claim 1.

18. A communication apparatus comprising:
    the front-end circuit according to claim 17; and
    an RFIC connected to the transmission-side amplification circuit and the reception-side amplification circuit and generating a control signal for the switch.

19. A high-frequency filter supporting a first communication band and a second communication band having a center frequency higher than the first communication band and partly overlapped with the first communication band, and including a first terminal and a second terminal, comprising:
- a ladder resonant circuit placed between the first terminal and the second terminal and including one or more series arm resonators and one or more parallel arm resonators; and
- a first attenuation circuit connected to a node between the ladder resonant circuit and the second terminal,
- wherein the first attenuation circuit includes a resonator and a switch,
- wherein one end of the resonator is connected to a first selection target terminal of the switch and another end of the resonator is connected to a ground potential,
- wherein the switch includes the first selection target terminal connected to the resonator, a second selection target terminal connected to a ground, and a common terminal selectively connected to the first selection target terminal or the second selection target terminal and connected to the node, and
- wherein the high-frequency filter switches between a state for a second communication band where the common terminal and the first selection target terminal of the switch are connected and a state for a first communication band where the common terminal and the second selection target terminal of the switch are connected.

20. The high-frequency filter according to claim 19, further comprising a longitudinally coupled resonant circuit including a plurality of longitudinally coupled resonators and connected in series to the ladder resonant circuit.

* * * * *

UNITED STATES PATENT AND TRADEMARK OFFICE
CERTIFICATE OF CORRECTION

PATENT NO.        : 10,200,012 B2
APPLICATION NO.   : 15/718330
DATED             : February 5, 2019
INVENTOR(S)       : Hideki Tsukamoto et al.

Page 1 of 1

It is certified that error appears in the above-identified patent and that said Letters Patent is hereby corrected as shown below:

In the Specification

Column 9, Line 61: "inductor (a" should read --inductor 42 (a--

Signed and Sealed this
Fourteenth Day of May, 2019

Andrei Iancu
*Director of the United States Patent and Trademark Office*